US005673181A

United States Patent [19]

Hsu

[11] Patent Number: 5,673,181
[45] Date of Patent: Sep. 30, 1997

[54] IC CARD ASSEMBLY

[76] Inventor: Fu-Yu Hsu, No. 44-1, Potu Tayuan Hsiang, Taoyung Hsien, Taiwan

[21] Appl. No.: 636,330

[22] Filed: Apr. 23, 1996

[51] Int. Cl.$^6$ ........................................................ H05K 1/00
[52] U.S. Cl. .................... 361/760; 361/737; 361/818; 361/686; 439/76.1; 439/946
[58] Field of Search .................... 361/726, 28, 29, 361/30, 36, 37, 39, 40, 41, 47, 49, 53, 59, 212, 220; 174/51; 439/946, 76.1, 607, 906

[56] References Cited

U.S. PATENT DOCUMENTS

| 5,339,222 | 8/1994 | Simmons | 361/818 |
| 5,490,043 | 2/1996 | Tan | 361/818 |
| 5,493,477 | 2/1996 | Hirai | 361/737 |

Primary Examiner—Leo P. Picard
Assistant Examiner—David Foster
Attorney, Agent, or Firm—Morton J. Rosenberg; David I. Klein

[57] ABSTRACT

An IC card assembly includes an upper housing, a circuit board, a pair of mounting frames, a lower housing and a ground element. The upper housing has both sides extending inwardly to form retain portions; the mounting frames are injection molded integrally with the lower housing; the lower housing has upwardly extending side walls at both lateral sides for closing the mounting frames, and either side wall is provided with a groove for receiving the retain portion of the upper housing. The upper housing and the lower housing may be easily and speedily coupled together without any need for welding or rivets. Besides, the surfaces of the IC card is even and uniform and will not scratch the IC card mounting slot or the user's hand.

1 Claim, 8 Drawing Sheets

IC CARD ASSEMBLY

BACKGROUND OF THE INVENTION (a) Field of the Invention

The present invention relates generally to an IC card assembly structure, and more particularly to an IC card assembly which is easy to assemble and has uniform appearance as well as firm connection.

(b) Description of the Prior Art

Personal computers are generally equipped with IC cards. For basic structures of IC cards, reference may be made to U.S. Pat. Nos. 5,038,250, 4,149,027, 4,729,741 and 4,868,713. A conventional IC card structure is illustrated in FIGS. 1 and 2. The prior IC card essentially comprises an upper housing 1, a circuit board 2, a pair of mounting frames 3 and a lower housing 4. The upper housing 1 has a body 11 which has both lateral sides thereof extending downwardly to form respective bent portions 12, which in turn bend inwardly to form respective hook portions 121. Two bent portions 13 each having a hook element 131 are provided at both the front and the rear ends of the body 11. The mounting frames 3 are elongate structures secured at both sides of the lower housing 4. The inner side of each mounting frame 3 is provided with a flange 31 for supporting and positioning the circuit board 2.

There are however the following drawbacks with the prior IC card structures:

1. In the prior IC cards, the upper housing 1 and the lower housing 4 are coupled together by utilizing the hook portions 121 of the bent portions 12 at both sides of the body 11 to hook against a bottom of the lower housing 4 from both sides and the hook elements 131 of the bent portions 13 at the front and rear ends of the body 11 to hook against the bottom of the lower housing 4 from both ends. The edges of these hook portions 121 and hook elements 131 are however easy to lift up. As a result, when the IC card is being inserted into a card mounting slot of the computer, the edges of the hook portions 121 and hook elements 131 may damage the card mounting slot.

2. Although welding or rivets may be applied at the hook portions 121 and the hook elements 131 after the upper and lower housings 1, 4 are connected to prevent the hook portions 121 and the hook elements 131 from being lifted easily, the uniform appearance of the IC card will be marred and it is time- and labor-consumptive as well as cost ineffective to hold them in place by means of welding or rivets.

3. Whether or not welding or rivets are used, the hook portions 121 and the hook elements 131 at the bottom of the lower housing 4 will have burred edges, which may scratch the hands of the user and are unsightly as well.

SUMMARY OF THE INVENTION

Accordingly, a primary object of the present invention is to provide an IC card in which after an upper housing and a lower housing are joined together, there is not any hook on the outer surface so that very even and uniform card surfaces may be achieved and the card may not damage the computer's card mounting slot when being inserted therein.

Another object of the present invention is to provide an IC card in which mounting of the card is simple and convenient, without the need to use welding or rivets.

A further object of the present invention is to provide an IC card in which the card has even and uniform surfaces and will not scratch the hands of the user.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENT

Figure 1:
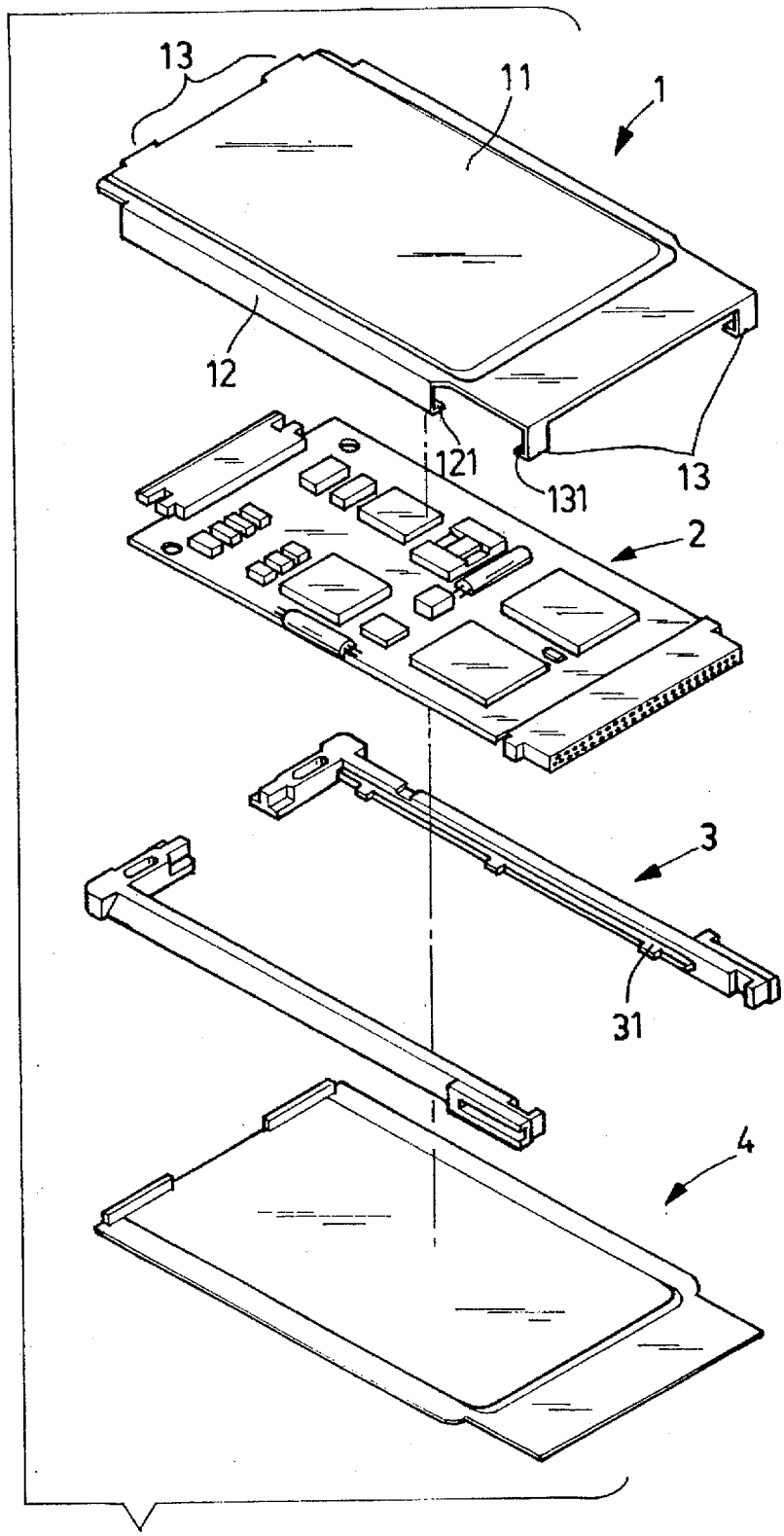
FIG. 1 is an elevational view of a prior IC card structure in an exploded state.
Figure 2:
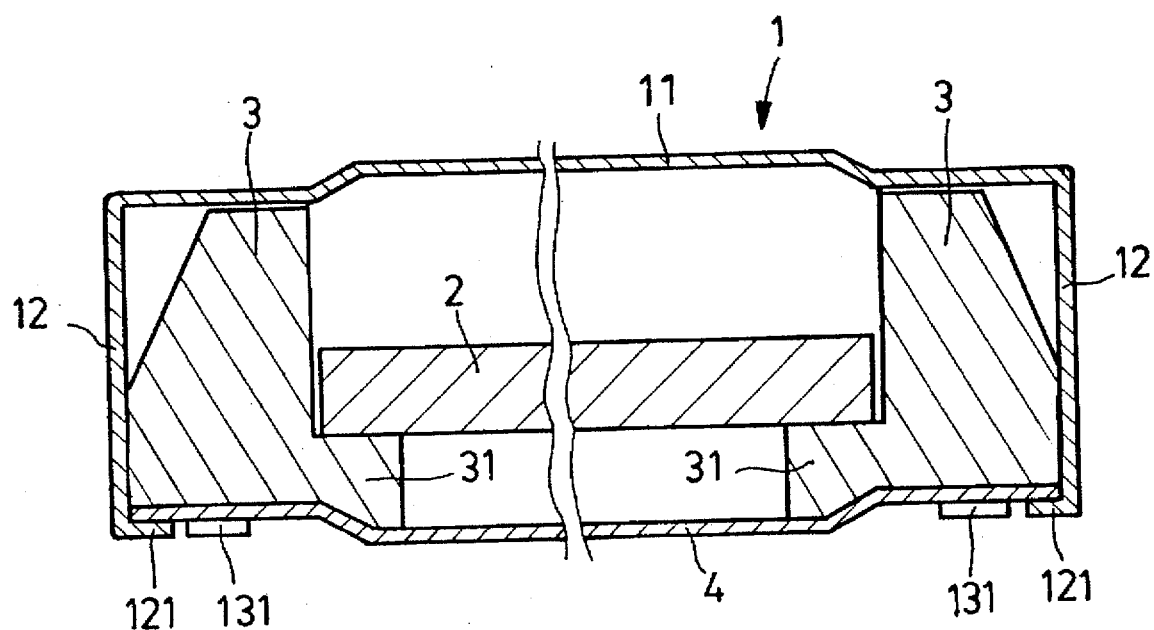
FIG. 2 is a sectional view of the prior IC card shown in FIG. 1.

With reference to FIGS. 3 to 11, a preferred embodiment of the IC card assembly according to the present invention essentially comprises an upper housing 5 punched from a metal sheet and having either side 51 extending downwardly and then inwardly to form a retain portion 52; a circuit board 6 having one end forming a card slot connecting means 61 and the other end forming an I/O connecting means 62; a pair of mounting frames 7 each of which has a flange 71 provided on an inner side thereof for supporting the circuit board 6, a first mounting slot 72 at a front end thereof orienting inwardly for receiving a card slot connecting means 61 of the circuit board 6, and a second mounting slot 73 at a rear end thereof orienting inwardly for receiving an I/O connecting means 62 of the circuit board 6; a lower housing 8 punched from a metal sheet for receiving the pair of mounting frames 7 which are respectively secured at both sides thereof; and a ground element 9 made from metal sheet and secured on one of the mounting frames 7 such that a resilient end 91 of the ground element 9 extends inwardly to contact a ground pad 63 on the circuit board 6, wherein the upper housing 5 has its lateral sides 51 bending inwardly to form the retain portions 52; the mounting frames 7 are plastic injection molded and integrally formed with the lower housing 8; the lower housing 8 has lateral sides extending upwardly to form lateral side walls 81 for closing the sides of the mounting frames 7 secured thereon, each of the side walls 81 being provided with a groove 82 at a position relative to that of the retain portions 52 of the upper housing 5 for receiving the retain portions 52 inserted therein. By means of the above arrangement, the upper and lower housings 5, 8 may be speedily assembled without the need for welding or rivets. Besides, the outer surfaces of the IC card as a whole are even and uniform and will not scratch the IC card mounting slot or the user's hands.

Figure 3:
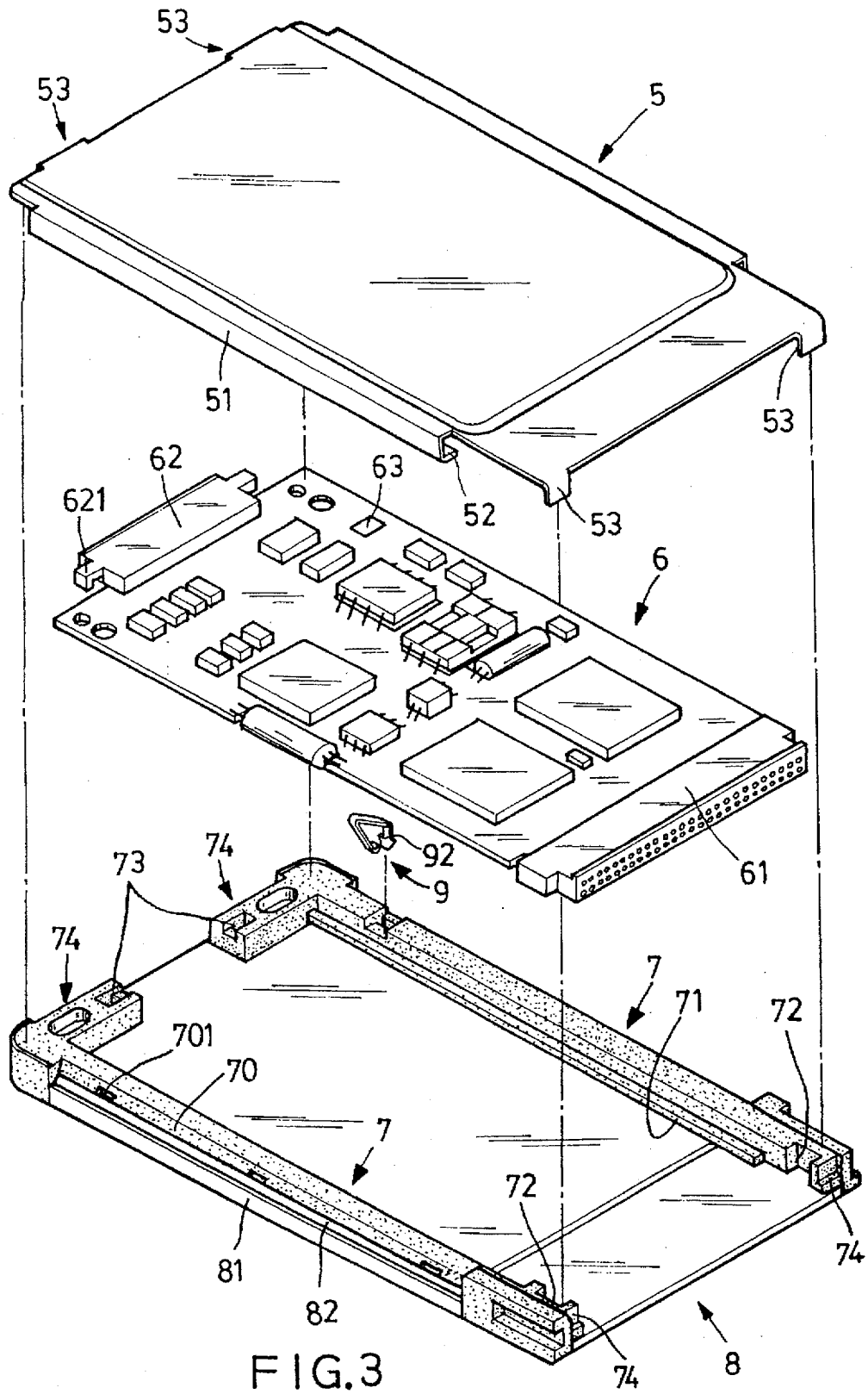
FIG. 3 is an elevational view of a preferred embodiment of the IC card assembly according to the present invention in an exploded state.
Figure 4:
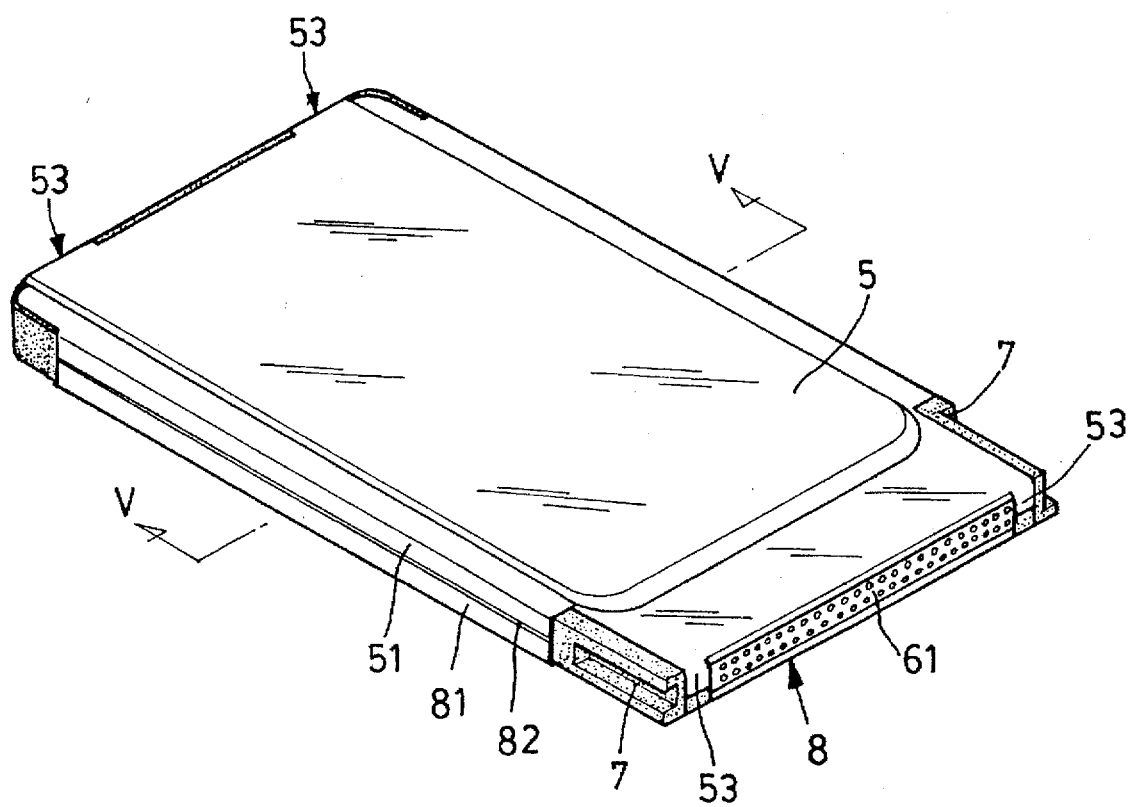
FIG. 4 is an elevational view of the IC card of the invention in an assembled state.
Figure 5:
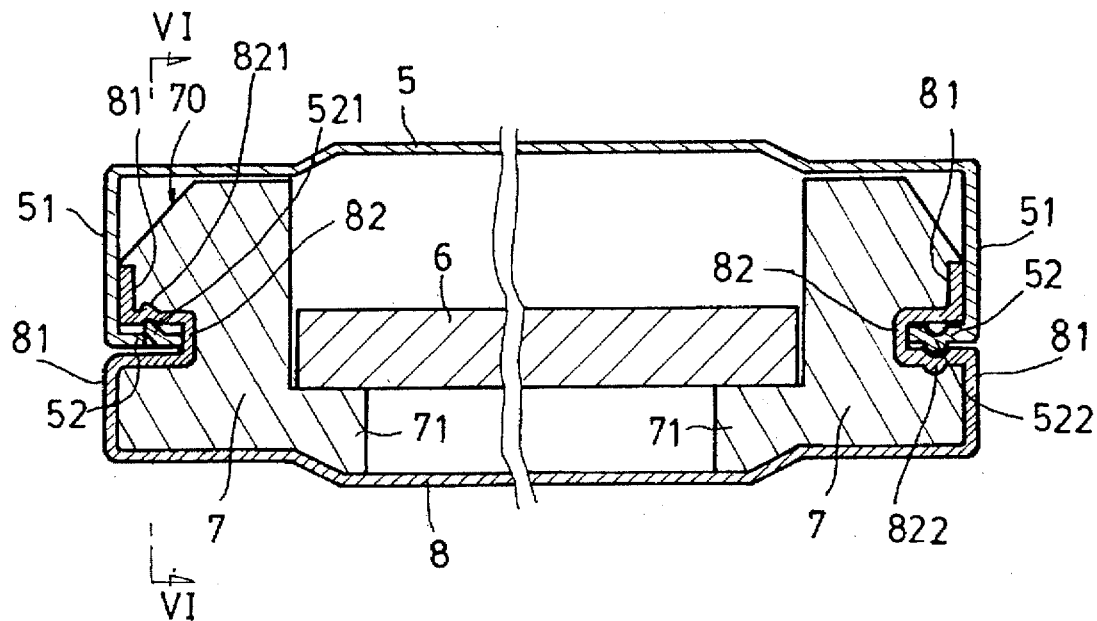
FIG. 5 is sectional view taken along line V—V of FIG. 5.

Referring to FIG. 3, each mounting frame 7 further has a recess 74 at its front and rear ends at a position relative to that of a positioning element 53 at a corner of the upper housing 5 for receiving the positioning element 53 so that the upper housing 5 may be prevented from forward or rearward displacement. After the positioning element 53 of the upper housing 5 is fitted into the recess 74 of the mounting frame 7, the positioning element 53 just flushes with the end surface of the mounting frame 7 to form an even surface so that it may not be easily lifted or scratch the computer's card mounting slot or the user's hands.

Figure 6:
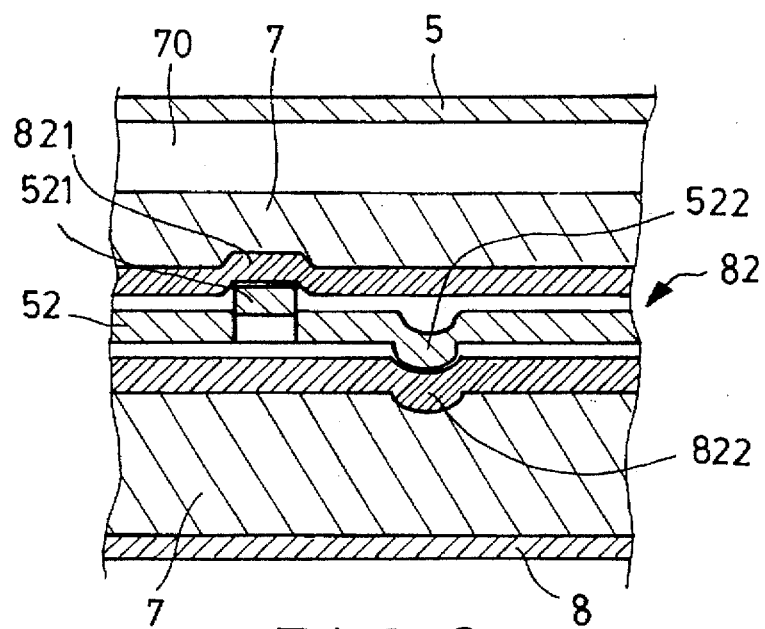
FIG. 6 is an enlarged schematic view of the IC card assembly of the invention in part.
Figure 7:
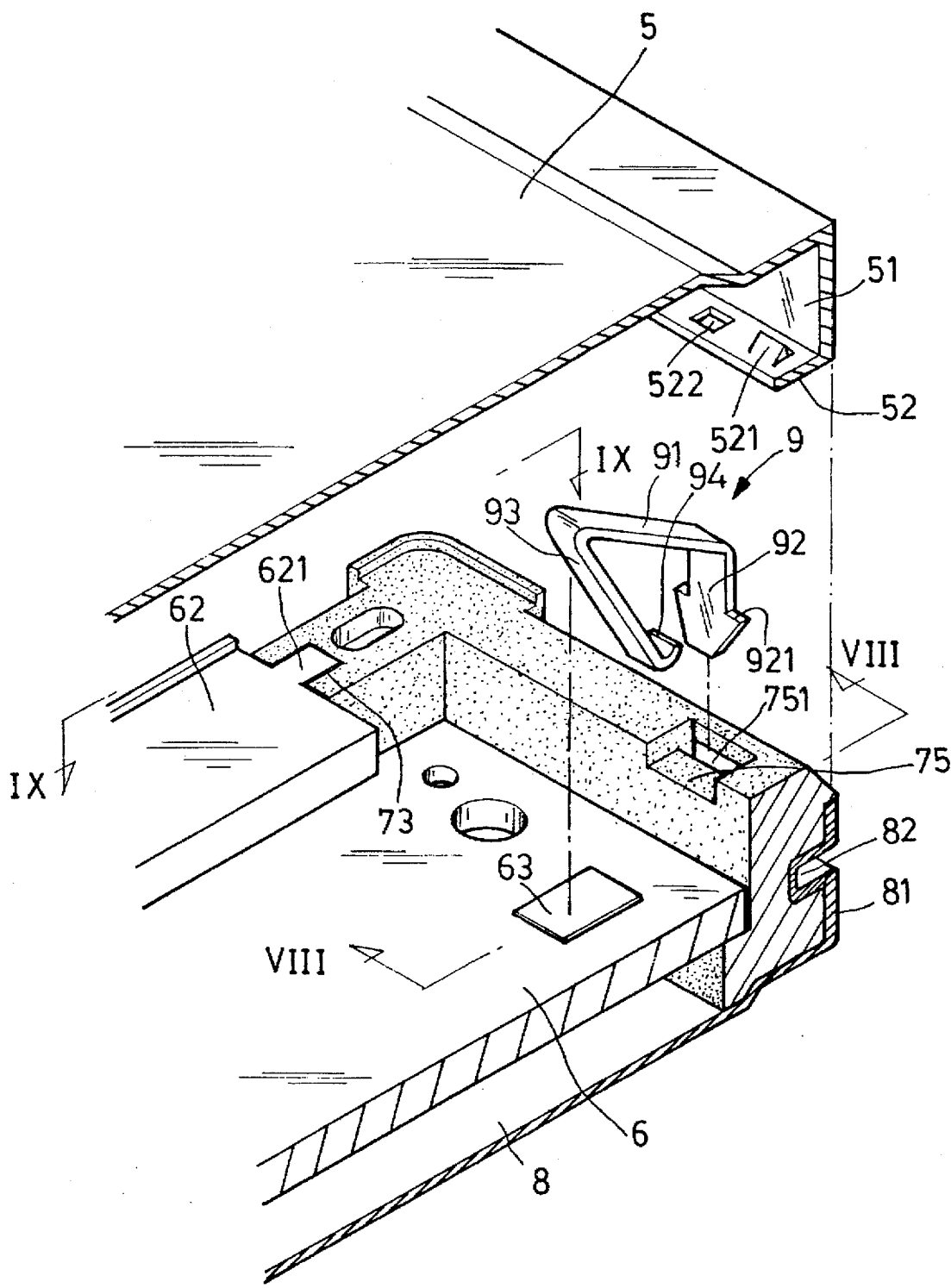
FIG. 7 is a schematic view of the IC card assembly of the invention in part.

With further reference to FIGS. 6 and 7, the upper surface of retain portions 52 of the upper housing 5 are punched to form a plurality of protrudent stop blocks 521 and concavities 522 while the grooves 82 of the lower housing 8 are provided with a plurality of recessed portions 821 and concavities 822 at its upper and lower surfaces for matching the stop blocks 521 and concavities 522 of the upper housing 5. By this arrangement, the stop blocks 521 may fit into the recessed portions 821 at the upper surface of the each groove 82 while the concavities 522 fit into the concavities 822 at the lower surface of the groove 82, so that the upper housing 5 and the lower housing 8 may be firmly coupled together and prevented from being lifted.

Figure 8:
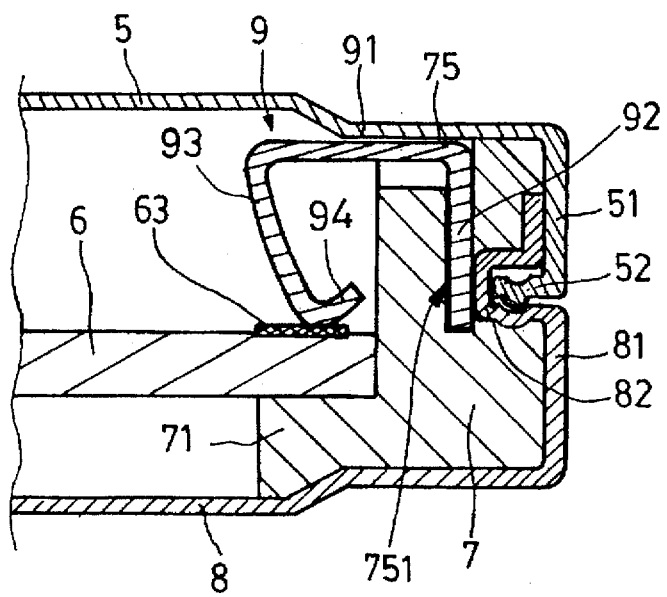
FIG. 8 is is a schematic view of a ground element of the IC card assembly of the invention.

Furthermore, with reference to FIGS. 7 and 8, the ground element 9 has its resilient end 91 sloping slightly upward and a vertical insert piece 92 at a rear end thereof. The insert piece 92 is provided with two protruding retain portions 921 at both sides thereof. In addition, the resilient end 91 has a front part thereof bending inwardly to form a resilient portion 93 the extreme end of which in turn forms a contact portion 94. Referring to FIG. 7, one of the mounting frames 7 is provided with a depression 75 in an upper side thereof. The depression 75 has a vertical mounting slot 751 for receiving the insert piece 92 so that the retain portion 921 may be retained in the mounting slot 751.

With reference to FIG. 8, after the insert piece 92 of the ground element 9 is fitted into the mounting slot 751 of the mounting frame 7, the insert piece 92 is in contact with a vertical side of the groove 82 of the lower housing 8. And after the upper housing 5 is coupled with the lower housing 8, the resilient end 91 presses downwardly and has surface contact with the lower side of the upper housing 5. Besides, the resilient portion 93 pushes against the circuit board 6 so that the contact portion 94 presses tightly against the ground pad 63 to make the ground connection. By means of this arrangement, when the IC card is connected with the IC card mounting slot, grounding may be electrically and mechanically achieved. In the present invention, the disadvantages of using the conventional ground element for respectively connecting the upper housing 5 and the lower housing 8 are eliminated by use of a separate ground element 9 for simultaneously contacting both the upper housing 5 and the lower housing 8 to achieve electric power transmission and grounding effects.

Figure 9:
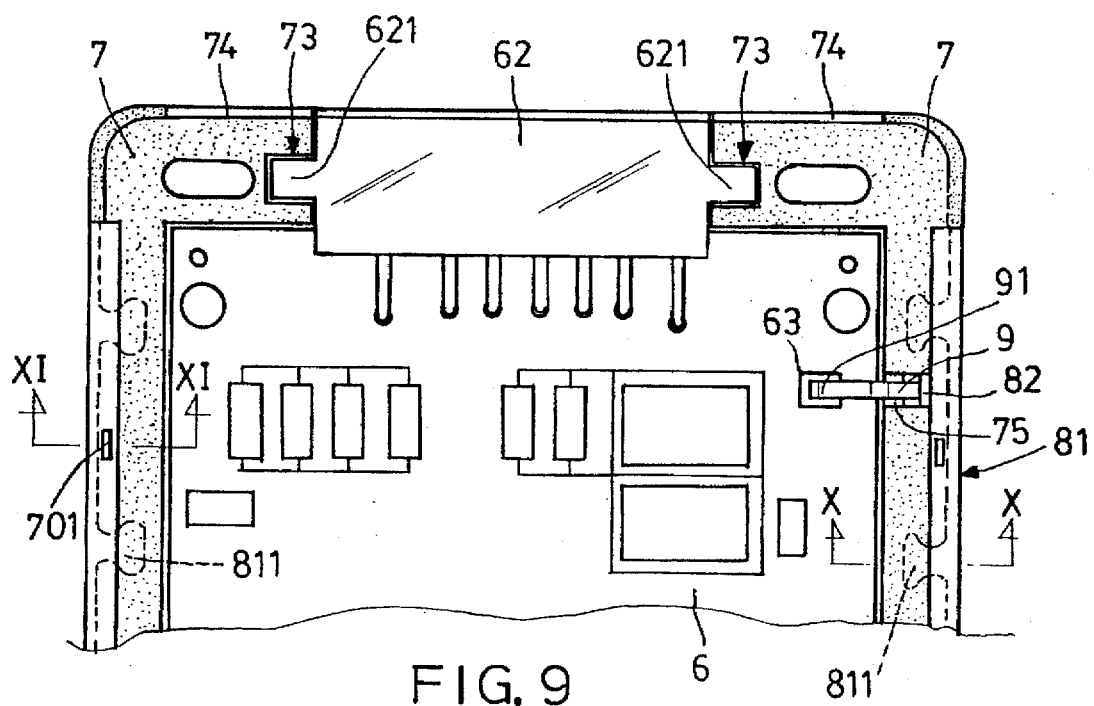
FIG. 9 is a partly sectional view taken along line IX—IX of FIG. 6.
Figure 10:
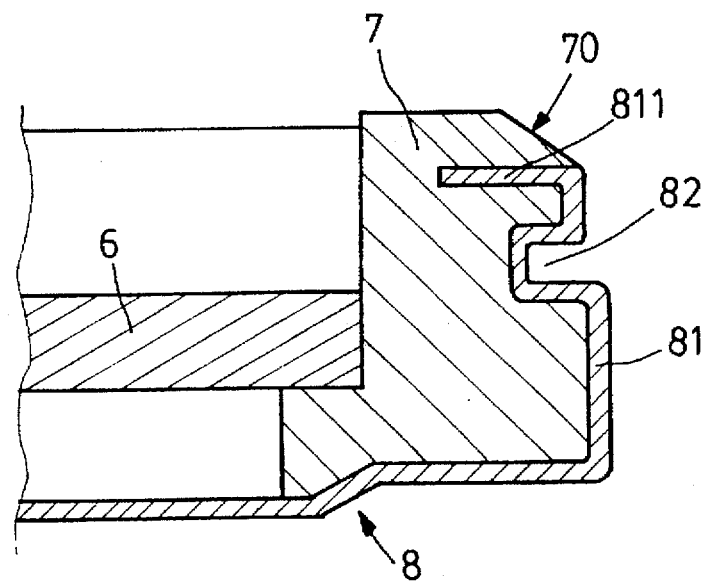
FIG. 10 is a schematic sectional view taken along line X—X of FIG. 9.

Furthermore, with reference to FIG. 9, which is a top view of the present invention in which the upper housing 5 is not yet coupled with the lower housing 8. The I/O connecting means 62 at one end of the circuit board 6 has two projecting pieces 621 extending from both sides thereof into the second mounting slots 73 of the pair of mounting frames 7. In addition, as shown in FIGS. 9 and 10, the side walls 81 of the lower housing 8 are respectively provided with a plurality of tongues 811 so that when the lower housing is injection molded together with the plastic mounting frames 7, they may be firmly secured and will not be detached from each other.

Figure 11:
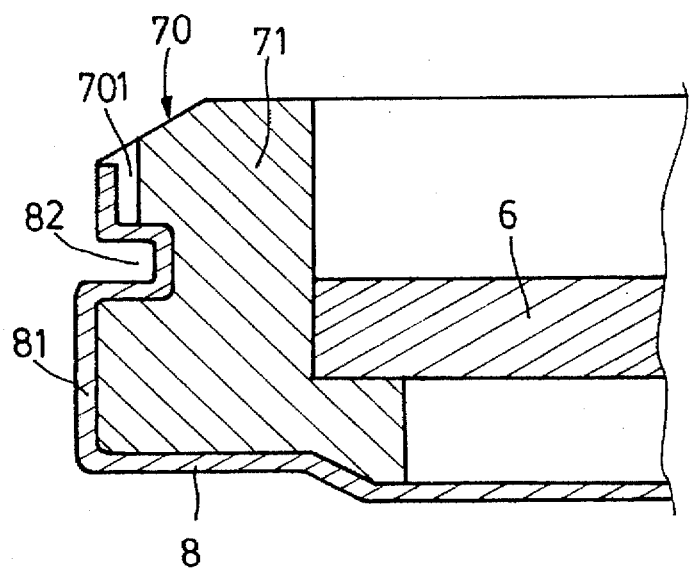
FIG. 11 is a schematic sectional view taken along line XI—XI of FIG. 9.

With further reference to FIGS. 3, 9 and 11, each mounting frame 7 additionally has a sloping lateral side wall 70 which is provided with a plurality of vertical slots 701 for receiving clamp elements (not shown) of an injection molding device (not shown) to ensure the side walls of the lower housing 8 may not displace or deform in shape during injection molding of the lower housing 8 and the mounting frames 7.

In summary, the present invention has the following advantages over the prior art:

1. As the mounting frames 7 and the lower housing 8 are integrally formed, they are firmly secured together and hence the circuit board 6 supported by the mounting frames 7 may be stably and securely positioned.
2. The arrangement of the grooves 82 at both side walls of the lower housing 8 and the retain portions 52 at the lateral sides 51 of the upper housing for fitting into the grooves 82 allows the upper housing 5 and the lower housing 8 to be speedily assembled. Besides, there is not any burr on the surface which may scratch the IC card slot or the user's hand, and the edges of the upper and lower housings 5, 8 may not be easily lifted or deformed, hence increasing the strength and life of the IC card.
3. Though it is very simple in construction, the ground element 9 is able to contact both the upper housing 5 and the lower housing 8 to achieve grounding. Thus, even if its contact with either the upper housing 5 or the lower housing 8 is poor, the desired grounding effects may still be achieved.

Although the present invention has been illustrated and described with reference to the preferred embodiment thereof, it should be understood that it is in no way limited to the details of such embodiment but is capable of numerous modifications within the scope of the appended claims.

What is claimed is:

1. An IC card assembly, comprising:

a lower housing formed from a metal sheet, said lower housing having a pair of opposing longitudinally extended sides with a longitudinally extended groove formed therein, each of said longitudinally extended sides having a plurality of tongues extending therefrom in longitudinally spaced relationship, each said groove having an upper surface with a plurality of recesses formed in spaced longitudinal relationship and a lower surface with a plurality of concavities formed in spaced longitudinal relationship;

a pair of mounting frames respectively disposed adjacent said longitudinally extended sides and molded integrally to said plurality of tongues, each of said pair of mounting frames having a flange extending from an interior facing side thereof;

a circuit board disposed between said pair of mounting frames and supported by said flanges thereof, said circuit board having a ground pad formed thereon;

a ground element having an inwardly bent resilient first end for electrical contact with said ground pad, said ground element having an opposing second end disposed within an aperture formed in one of said pair of mounting frames and making electrical contact with said lower housings and, an upper housing formed from a metal sheet, said upper housing having a pair of opposing longitudinally extended sides, each of said pair of sides of said upper housing having an inwardly directed portion inserted into a respective one of said grooves, said inwardly directed portion having (a) a plurality of upwardly protruding stop blocks formed therein for respective engagement with said plurality of recesses of said upper surface of said groove, and (b) a plurality of downwardly projecting concavities formed therein for respective engagement with said plurality of concavities of said lower surface of said groove.

* * * * *